(12) United States Patent
Moon et al.

(10) Patent No.: US 11,411,197 B2
(45) Date of Patent: Aug. 9, 2022

(54) DISPLAY DEVICE HAVING REDUCED OUTGASSING FROM ORGANIC LAYERS

(71) Applicant: Samsung Display Co., LTD., Yongin-si (KR)

(72) Inventors: Sang Ho Moon, Cheonan-si (KR); Chun Gi You, Asan-si (KR); Tae Jong Eom, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 114 days.

(21) Appl. No.: 16/986,964

(22) Filed: Aug. 6, 2020

(65) Prior Publication Data

US 2021/0234119 A1  Jul. 29, 2021

(30) Foreign Application Priority Data

Jan. 29, 2020 (KR) ............... 10-2020-0010305

(51) Int. Cl.
*H01L 33/00* (2010.01)
*H01L 51/52* (2006.01)
*H01L 27/32* (2006.01)

(52) U.S. Cl.
CPC ...... *H01L 51/5228* (2013.01); *H01L 27/3246* (2013.01)

(58) Field of Classification Search
CPC .................. H01L 51/5228; H01L 27/3246
USPC ............................................. 257/99
See application file for complete search history.

(56) References Cited

U.S. PATENT DOCUMENTS

| 9,978,818 | B2 | 5/2018 | Xiong et al. | |
|---|---|---|---|---|
| 2008/0116463 | A1* | 5/2008 | Ito | H01L 51/5203 257/72 |
| 2014/0159002 | A1* | 6/2014 | Lee | H01L 51/5256 257/40 |
| 2015/0060786 | A1* | 3/2015 | Kwak | H01L 27/3262 257/40 |
| 2016/0013222 | A1* | 1/2016 | Park | H01L 29/66757 438/45 |
| 2016/0013436 | A1* | 1/2016 | Im | H01L 51/0017 257/40 |

(Continued)

FOREIGN PATENT DOCUMENTS

| KR | 10-0501427 | 7/2005 |
|---|---|---|
| KR | 10-2016-0055333 | 5/2016 |
| KR | 10-2019-0063570 | 6/2019 |

*Primary Examiner* — Phuc T Dang
(74) *Attorney, Agent, or Firm* — Kile Park Reed & Houtteman PLLC

(57) ABSTRACT

A display device includes a substrate including display and non-display areas, a driving element in the display area, a first via layer on the driving element and in the non-display area, a second via layer on the first via layer, a pixel electrode on the second via layer and overlapping the display area, an auxiliary electrode on the second via layer and overlapping the non-display area, a pixel defining layer on the second via layer and overlapping the pixel electrode, organic layer patterns on the second via layer and overlapping the auxiliary electrode, a light emitting layer on the pixel electrode, and a common electrode on the light emitting layer and the auxiliary electrode and electrically connected to the auxiliary electrode. The auxiliary electrode includes electrode holes, and an organic layer pattern includes a pattern hole overlapping an electrode hole.

21 Claims, 15 Drawing Sheets

(56) References Cited

U.S. PATENT DOCUMENTS

2016/0035813 A1* 2/2016 Lee ..................... H01L 51/56
  257/40

* cited by examiner

DISPLAY DEVICE HAVING REDUCED OUTGASSING FROM ORGANIC LAYERS

CROSS-REFERENCE TO RELATED APPLICATION(S)

This application claims priority to and benefits of Korean Patent Application No. 10-2020-0010305 under 35 U.S.C. § 119, filed in the Korean Intellectual Property Office on Jan. 29, 2020, the entire contents of which are incorporated herein by reference.

BACKGROUND

1. Technical Field

The disclosure relates to a display device.

2. Description of the Related Art

The importance of display devices has steadily increased with the development of multimedia technology. Accordingly, various types of display devices such as a liquid crystal display (LCD), an organic light emitting display (OLED) and the like have been used.

Among them, the organic light emitting display may be a self-light emitting device that emits light by itself and has advantages such as fast response speed, high luminous efficiency and luminance, and a large viewing angle. The organic light emitting display may include pixels in a single panel. Each pixel may include an organic light emitting diode (OLED) disposed on a substrate on which a thin film transistor may be formed.

The display device as described above may include organic layers. However, the organic layers may generate gas by heat treatment during a manufacturing process to cause electrode oxidation by the gas. Thus, it may lead to a reduction in reliability and a display failure of the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure may provide a display device capable of preventing a display failure by reducing the amount of outgassing generated from organic layers.

However, aspects of the disclosure are not restricted to any set forth herein. The above and other aspects of the disclosure will become more apparent to one of ordinary skill in the art to which the disclosure pertains by referencing the detailed description of the disclosure given below.

According to an embodiment, there may be provided a display device that may include a substrate including a display area and a non-display area, a driving element disposed in the display area, a first via layer disposed on the driving element and in the non-display area, a second via layer disposed on the first via layer, a pixel electrode disposed on the second via layer and overlapping the display area, an auxiliary electrode disposed on the second via layer and overlapping the non-display area, a pixel defining layer disposed on the second via layer and overlapping the pixel electrode, organic layer patterns disposed on the second via layer and overlapping the auxiliary electrode, a light emitting layer disposed on the pixel electrode, and a common electrode disposed on the light emitting layer and the auxiliary electrode, the common electrode being electrically connected to the auxiliary electrode, wherein the auxiliary electrode includes electrode holes, and at least one of the organic layer patterns includes a pattern hole overlapping at least one of the electrode holes.

The electrode holes may be through-holes passing through the auxiliary electrode, and the pattern hole may be a through-hole passing through a corresponding one of the organic layer patterns.

At least one of the organic layer patterns may surround at least one of the electrode holes, overlap the auxiliary electrode adjacent to the electrode hole, and contact the auxiliary electrode.

At least one of the organic layer patterns may overlap at least one of the electrode holes, and contact the second via layer through the electrode hole.

The pattern hole may overlap the electrode hole and may not overlap the auxiliary electrode.

The common electrode may be in contact with the second via layer through the pattern hole.

An area between the organic layer patterns spaced apart from each other may overlap the auxiliary electrode, and the common electrode may be in contact with the auxiliary electrode through the area between the organic layer patterns spaced apart from each other.

The second via layer may include a first via hole overlapping the electrode hole and the pattern hole, and a side surface of the first via hole may be aligned with a side surface of the pattern hole.

The common electrode may be in contact with the first via layer through the pattern hole and the first via hole.

The first via layer may include a second via hole overlapping the electrode hole, the pattern hole and the first via hole, and an insulating layer may be disposed between the driving element and the first via layer.

A side surface of the second via hole may be aligned with a side surface of the first via hole.

The common electrode may be in contact with the insulating layer through the pattern hole, the first via hole and the second via hole.

A planar shape of the organic layer patterns may be a closed loop shape.

The organic layer patterns and the pixel defining layer may be disposed on a same layer and include a same material.

The auxiliary electrode and the pixel electrode may be disposed on a same layer and include a same material.

At least another one of the organic layer patterns may include a pattern groove overlapping at least another one of the electrode holes.

According to another embodiment, there may be provided a display device that may include a substrate including a display area and a non-display area, a driving element disposed in the display area, a first via layer disposed on the driving element and in the non-display area, a second via layer disposed on the first via layer, a pixel electrode disposed on the second via layer and overlapping the display area, an auxiliary electrode disposed on the second via layer and overlapping the non-display area, a pixel defining layer and disposed on the second via layer and overlapping the pixel electrode, organic layer patterns disposed on the second via layer and overlapping the auxiliary electrode, a light emitting layer disposed on the pixel electrode, and a common electrode disposed on the light emitting layer and the auxiliary electrode, the common electrode being electrically connected to the auxiliary electrode, wherein the auxiliary electrode includes electrode holes, and at least one of the organic layer patterns includes a pattern groove overlapping at least one of the electrode holes.

Each of the organic layer patterns may include a pattern groove, and a depth of the pattern groove farther from the display area may be greater than a depth of a pattern groove closer to the display area.

Each of the organic layer patterns may include a pattern groove, and a depth of the pattern groove closer to the display area may be greater than a depth of a pattern groove farther from the display area.

At least one of the organic layer patterns may entirely cover at least one of the electrode holes.

According to a display device according to an embodiment, the volume of organic layers disposed below a common electrode can be reduced to thereby reduce the amount of outgassing generated from the organic layers. Therefore, it may be possible to reduce the oxidation of the common electrode due to outgassing and to prevent the display quality from deteriorating.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
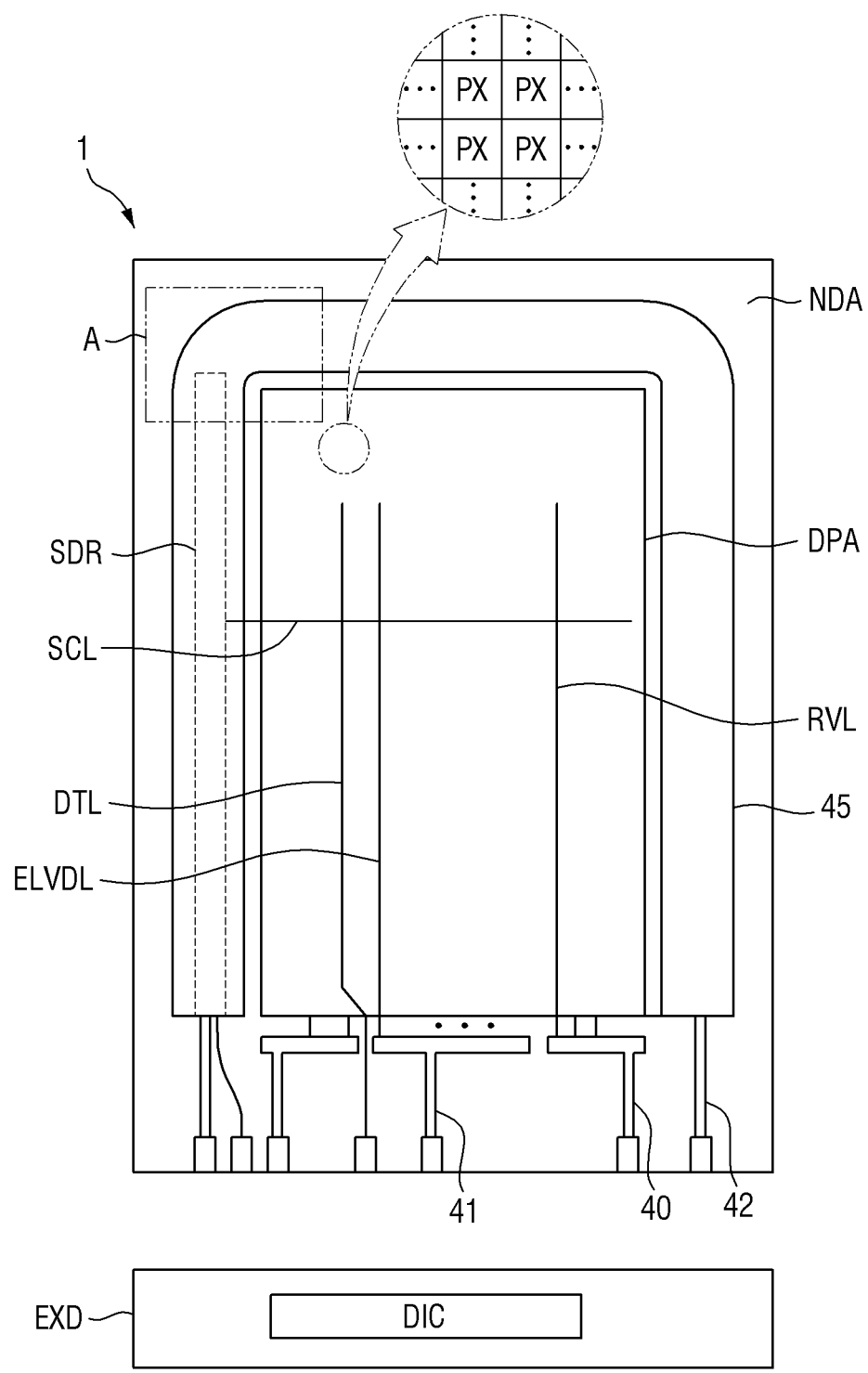
FIG. 1 is a schematic plan view of a display device according to an embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey aspects of the inventive concept to those skilled in the art, and the inventive concept will only be defined by the appended claims. Like reference numerals refer to like elements throughout the specification.

It will be understood that when an element or layer is referred to as being "on" (e.g., "disposed on"), "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there may be no intervening elements or layers present. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

Terms such as "overlap" may include layer, stack, face or facing, extending over, extending under, covering or partly covering or any other suitable term as would be appreciated and understood by those of ordinary skill in the art. Phrases such as "not overlap" may include "apart from" or "set aside from" or "offset from" and any other suitable equivalents as would be appreciated and understood by those of ordinary skill in the art.

When an element is referred to as being "in contact" or "contacted" or the like to another element, the element may be in "electrical contact" or in "physical contact" with another element; or in "indirect contact" or in "direct contact" with another element.

Terms such as "About" or "approximately" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Embodiments of the disclosure will hereinafter be described with reference to the accompanying drawings.

FIG. 1 is a schematic plan view of a display device according to an embodiment.

Referring to FIG. 1, a display device 1 according to an embodiment may be applied to a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances such as a refrigerator and a washing machine, or an Internet-of-Things device. Herein, a television (TV) is described as an example of a display device, and the TV may have a high resolution or an ultra high resolution such as HD, UHD, 4K and 8K.

The display device 1 according to the embodiments may be classified into various types according to a display method. Examples of the display device may include an organic light emitting display (OLED), an inorganic light emitting display (inorganic EL), a quantum dot light emitting display (QED), a micro-LED display, a nano-LED display, a plasma display device (PDP), a field emission display (FED) and a cathode ray tube (CRT) display, a liquid crystal display (LCD), an electrophoretic display (EPD) and the like. Hereinafter, the organic light emitting display will be described as an example of the display device, and the organic light emitting display applied to the embodiment will be simply referred to as a display device unless special distinction is required. However, the embodiment is not limited to the organic light emitting display, and other display devices mentioned above or known in the art may be applied within the scope of the same inventive concept.

The display device 1 may have a square shape, e.g., a rectangular shape in plan view. In a case where the display device 1 is a television, the display device 1 may be disposed such that its long side extends in a horizontal direction. However, the disclosure is not limited thereto, and the long side of the display device 1 may extend in a vertical direction. As another example, the display device 1 may be installed to be rotatable such that its long side is variably positioned to extend in the horizontal or vertical direction.

The display device 1 may include a display area DPA and a non-display area NDA. The display area DPA may be an active area in which an image may be displayed. The display area DPA may have a rectangular shape in plan view similar to the overall shape of the display device 1, but the disclosure is not limited thereto.

The display area DPA may include pixels PX. The pixels PX may be arranged in a matrix. The shape of each pixel PX may be rectangular or square in plan view. However, without being limited thereto, each pixel PX may have a rhombic shape of which each side may be inclined with respect to a side direction of the display device 1. The pixels PX may include various color pixels PX. For example, the pixels PX may include, a first color pixel PX of red, a second color pixel PX of green, and a third color pixel PX of blue, although not limited thereto. The color pixels PX may be alternately arranged in a stripe type or a pentile type.

The non-display areas NDA may be disposed around the display area DPA. The non-display areas NDA may completely or partially surround the display area DPA. The display area DPA may have a rectangular shape, and the non-display areas NDA may be disposed adjacent to four sides of the display area DPA. The non-display areas NDA may form a bezel of the display device 1.

In the non-display area NDA, a driving circuit or a driving element for driving the display area DPA may be disposed. In an embodiment, in the non-display area NDA disposed adjacent to the long side (lower side in FIG. 1) of the display device 1, a pad portion may be provided on a display substrate of the display device 1, and an external device EXD may be mounted on pad electrodes of the pad portion.

Examples of the external device EXD may include a connection film, a printed circuit board, a driver integrated circuit (DIC), a connector, a wire connection film and the like. For example, the driver integrated circuit (DIC) may be a data driving circuit, and may supply a data signal to each pixel PX through a data line DTL. The external device EXD may supply a first power voltage, a reference voltage and a second power voltage, respectively, to a first power line ELVDL, a reference voltage line RVL and a second power line 45 through connection wires 40, 41 and 42.

The second power line 45 may be disposed in the non-display area NDA and may surround the display area DPA. For example, the second power line 45 may surround the remaining periphery of the display area DPA except for the lower side of the display area DPA. The second power line 45 may supply a low potential voltage to a common electrode (i.e., a cathode electrode) of a light emitting element of the pixel PX.

A scan driver SDR formed on (e.g., directly formed on) the display substrate of the display device 1 may be provided in the non-display area NDA disposed adjacent to the short side (left side in FIG. 1) of the display device 1. Although one scan driver SDR is illustrated in FIG. 1 as an example of the scan driver SDR, the scan driver SDR may be additionally provided in the non-display area NDA adjacent to the right side of the display device 1. However, the disclosure is not limited thereto. The scan driver SDR may supply a scan signal to each pixel PX through a scan line SCL.

Hereinafter, the pixel PX of the display device 1 described above will be described in detail.

Figure 2:
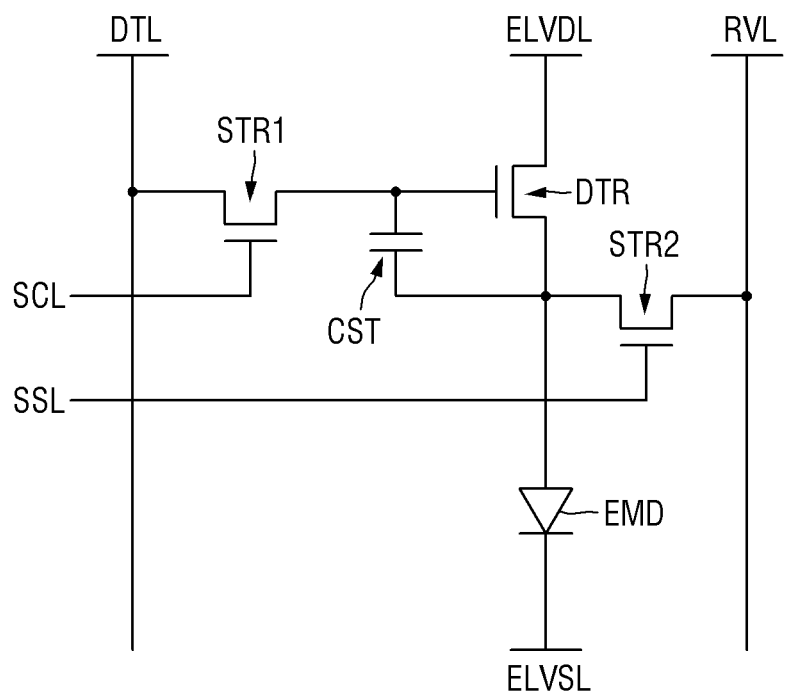
FIG. 2 is a schematic diagram of an equivalent circuit of a pixel of a display device according to an embodiment.

FIG. 2 is a schematic diagram of an equivalent circuit of a pixel of a display device according to an embodiment.

Referring to FIG. 2, a pixel PX of the display device according to an embodiment may include three transistors DTR, STR1 and STR2 and one storage capacitor CST in addition to a light emitting element EMD.

The light emitting element EMD may emit light according to a current supplied through a driving transistor DTR. The light emitting element EMD may be implemented as an OLED, a micro light emitting diode, a nano light emitting diode or the like.

A pixel electrode (i.e., an anode electrode) of the light emitting element EMD may be electrically connected to a source electrode of the driving transistor DTR, and a common electrode (i.e., a cathode electrode) of the light emitting element EMD may be electrically connected to a second power line ELVSL to which a low potential voltage (second power voltage) lower than a high potential voltage (first power voltage) of the first power line ELVDL may be supplied.

The driving transistor DTR may adjust a current flowing from the first power line ELVDL, to which the first power voltage may be applied, to the light emitting element EMD according to a voltage difference between a gate electrode and the source electrode. The gate electrode of the driving transistor DTR may be electrically connected to a first source or drain electrode of the first switching transistor STR1, the source electrode of the driving transistor DTR may be electrically connected to the first electrode of the light emitting element EMD, and a drain electrode of the driving transistor DTR may be electrically connected the first power line ELVDL to which the first power voltage may be applied.

The first switching transistor STR1 may be turned on by a scan signal applied from the scan line SCL to electrically connect the data line DTL to the gate electrode of the driving transistor DTR. A gate electrode of the first switching transistor STR1 may be electrically connected to the scan line SCL, the first source or drain electrode of the first switching transistor STR1 may be electrically connected to the gate electrode of the driving transistor DTR, and a second source or drain electrode of the first switching transistor STR1 may be electrically connected to the data line DTL.

The second switching transistor STR2 may be turned on by a sensing signal applied from the sensing signal line SSL to electrically connect the reference voltage line RVL to the source electrode of the driving transistor DTR. A gate electrode of the second switching transistor STR2 may be electrically connected to the sensing signal line SSL, the first source or drain electrode of the second switching transistor STR2 may be electrically connected to the reference voltage line RVL, and the second source or drain electrode of the second switching transistor STR2 may be electrically connected to the source electrode of the driving transistor DTR.

In one embodiment, the first source or drain electrode of each of the first and second switching transistors STR1 and STR2 may be a source electrode, and the second source or drain electrode of each of the first and second switching transistors STR1 and STR2 may be a drain electrode. However, the disclosure is not limited thereto, and the opposite case may be applied.

The capacitor CST may be formed between the gate electrode and the source electrode of the driving transistor DTR. The storage capacitor CST may store a difference voltage between a gate voltage and a source voltage of the driving transistor DTR.

The driving transistor DTR, the first switching transistor STR1, and the second switching transistor STR2 may be formed as thin film transistors. Further, in the description of FIG. 2, it may be assumed that the driving transistor DTR, the first switching transistor STR1, and the second switching transistor STR2 are N-type metal oxide semiconductor field effect transistors (MOSFETs), but the disclosure is not limited thereto. For example, the driving transistor DTR, the first switching transistor STR1, and the second switching transistor STR2 may be P-type MOSFETs, or some of the driving transistor DTR, the first switching transistor STR1, and the second switching transistor STR2 may be N-type MOSFETs, while others may be P-type MOSFETs.

Figure 3:
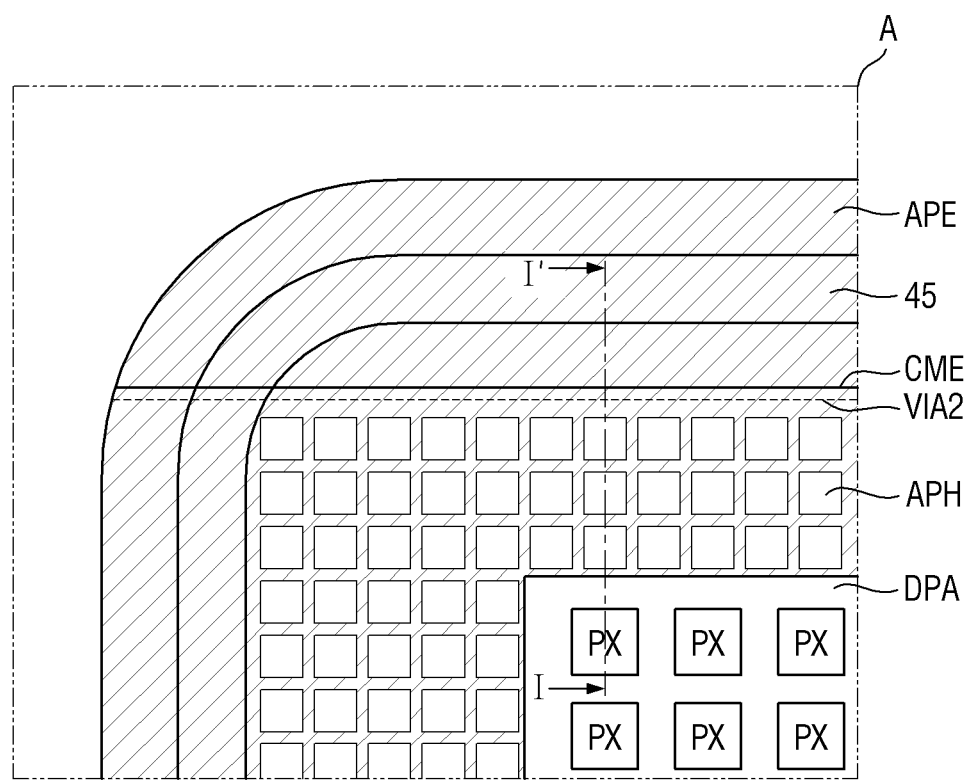
FIG. 3 is an enlarged schematic plan view of region A of FIG. 1.

FIG. 3 is an enlarged schematic plan view of region A of FIG. 1.

Referring to FIG. 3, pixels PX may be disposed in the display area DPA. In the non-display area NDA surrounding the display area DPA, a second power line 45 may be disposed to surround the display area DPA, and an auxiliary electrode APE electrically connected to the second power line 45 may be disposed. The second power line 45 and the auxiliary electrode APE may overlap each other. In the non-display area NDA adjacent to the display area DPA, a second via layer VIA2 may be disposed between the second power line 45 and the auxiliary electrode APE.

The auxiliary electrode APE may include electrode holes APH for discharging gas generated in the second via layer VIA2 disposed therebelow. A common electrode CME overlapping the auxiliary electrode APE may be disposed to be electrically connected to the auxiliary electrode APE. The common electrode CME may be provided with a second power voltage having a low potential through the second power supply line 45 electrically connected to the auxiliary electrode APE.

Hereinafter, a detailed structure of the display device will be described with reference to a cross-sectional view taken along line I-I' of FIG. 3.

Figure 4:
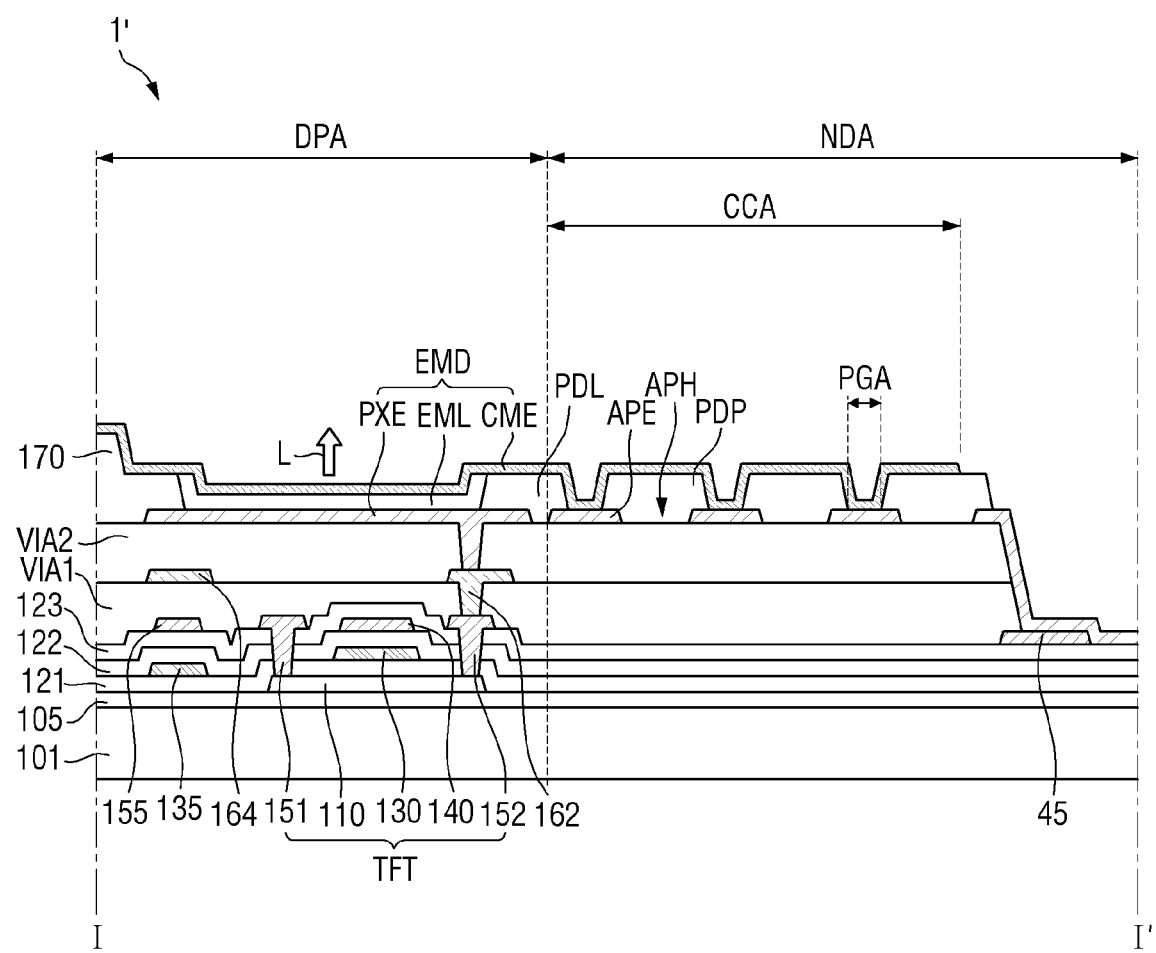
FIG. 4 is a view schematically showing a cross-sectional structure taken along cutting line I-I' of FIG. 3 according to some embodiments.
Figure 5:
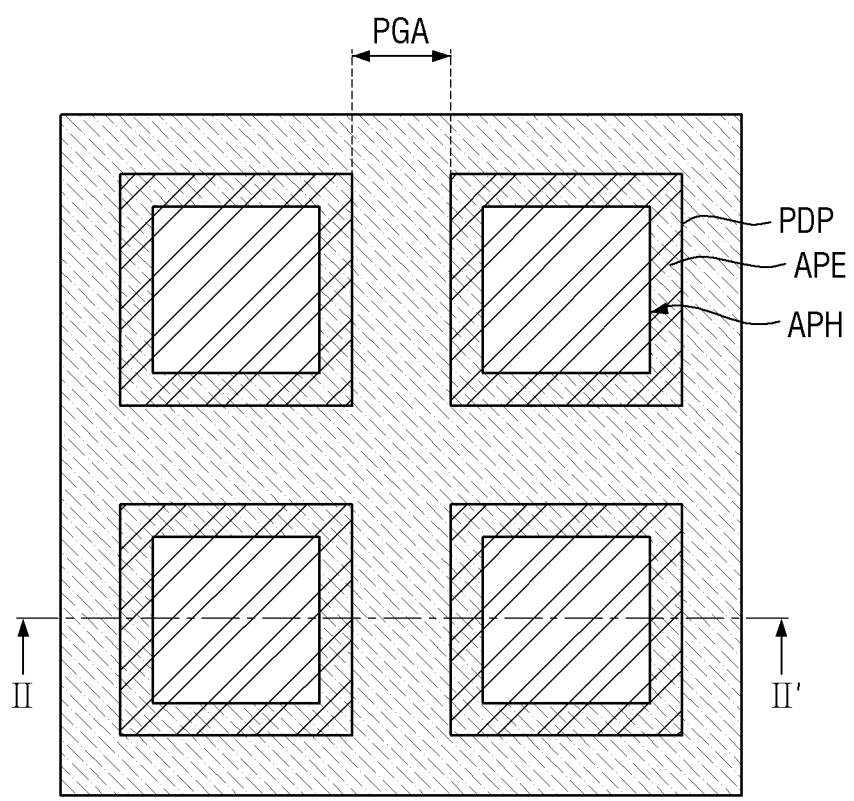
FIG. 5 is a plan view schematically illustrating a portion of a common electrode contact portion of FIG. 4.
Figure 6:
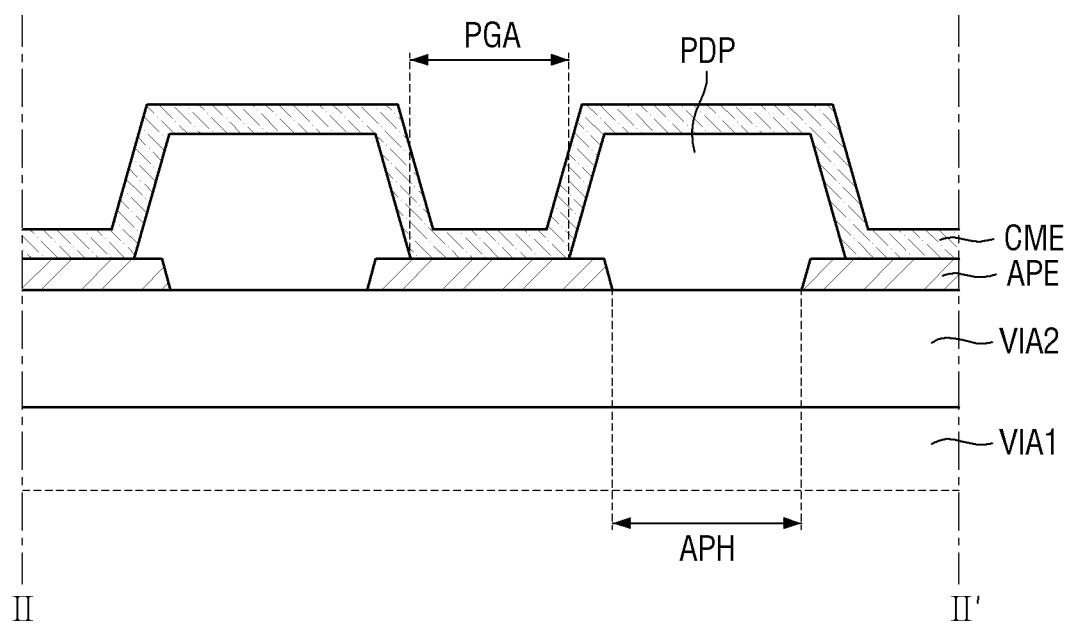
FIG. 6 is a view schematically showing a cross-sectional structure taken along cutting line II-II' of FIG. 5.

FIG. 4 is a view schematically showing a cross-sectional structure taken along cutting line I-I' of FIG. 3 according to some embodiments. FIG. 5 is a plan view schematically illustrating a portion of a common electrode contact portion of FIG. 4. FIG. 6 is a view schematically showing a cross-sectional structure taken along cutting line II-II' of FIG. 5.

FIG. 4 illustrates a top emission type display device in which light L may be emitted in a direction opposite to a direction toward a substrate 101 on which a light emitting layer EML may be formed. However, the disclosure is not limited thereto. The display device may be of a bottom emission type in which light may be emitted in the direction toward the substrate 101 on which the light emitting layer EML may be formed, or a double-sided emission type in which light may be emitted in both the direction toward the substrate 101 and the direction opposite to the direction toward the substrate 101.

Referring to FIG. 4, the display device 1' may include the substrate 101. The substrate 101 may be an insulating substrate. The substrate 101 may include a transparent material. For example, the substrate 101 may include a transparent insulating material such as glass, quartz, or the like, or a combination thereof. The substrate 101 may be a rigid substrate. However, the substrate 101 is not limited thereto. The substrate 101 may include plastic such as polyimide or the like, and may have a flexible property such that it can be curved, bent, folded, or rolled.

In an embodiment, the display device 1' may include a display area DPA and a non-display area NDA disposed on the substrate 101. In the display area DPA, a thin film transistor TFT and a light emitting element EMD may be disposed. The non-display area NDA may be an area other than the display area DPA.

A buffer layer 105 may be disposed on the substrate 101. The buffer layer 105 may be disposed on one surface of the substrate 101 to protect the thin film transistor TFT and the light emitting element EMD from moisture penetrating through the substrate 101 susceptible to moisture permeation. The buffer layer 105 may be formed of inorganic layers that may be alternately stacked on each other. For example, the buffer layer 105 may be formed of multiple layers in which one or more inorganic layers of a silicon nitride layer, a silicon oxynitride layer, a silicon oxide layer, a titanium oxide layer and an aluminum oxide layer may be alternately stacked on each other. The buffer layer 105 may be omitted.

The thin film transistor TFT may be disposed as a driving element on the buffer layer 105. The thin film transistor TFT may be disposed in the display area DPA. The thin film transistor TFT may include a semiconductor layer 110, a first insulating layer 121, a second insulating layer 122, a third insulating layer 123, a first gate electrode 130, and a second gate electrode 140.

Although FIG. 4 illustrates that the thin film transistor TFT may be formed by a top gate method in which the gate electrodes 130 and 140 may be located above the semiconductor layer 110, the disclosure is not limited thereto. For example, the thin film transistor TFT may be formed by a bottom gate method in which the gate electrodes 130 and 140 may be located below the semiconductor layer 110, or a double gate method in which the gate electrodes 130 and 140 may be located both above and below the semiconductor layer 110.

For example, the semiconductor layer 110 of the thin film transistor TFT may be disposed on the buffer layer 105. The semiconductor layer 110 may include one or more of polycrystalline silicon, monocrystalline silicon, low-temperature polycrystalline silicon, amorphous silicon, or an oxide semiconductor. A light blocking layer may be formed between the buffer layer 105 and the semiconductor layer 110 to block external light incident on the semiconductor layer 110.

The first insulating layer 121 may be disposed on the semiconductor layer 110. The first insulating layer 121 may be formed of an inorganic layer, for example, a silicon nitride layer, a silicon oxynitride layer, a silicon oxide layer, a titanium oxide layer, an aluminum oxide layer, or a combination thereof.

The first gate electrode 130 and a first signal line 135 spaced apart from the first gate electrode 130 may be disposed on the first insulating layer 121. The first gate electrode 130 may overlap the semiconductor layer 110. The first signal line 135 may be a light emitting line, and may control the first power line ELVDL to turn on and off the first source voltage.

The first gate electrode 130 and the first signal line 135 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second insulating layer 122 may be disposed on the first gate electrode 130 and the first signal line 135. The second insulating layer 122 may be formed of an inorganic layer, for example, a silicon nitride layer, a silicon oxynitride layer, a silicon oxide layer, a titanium oxide layer, an aluminum oxide layer, or a combination thereof.

The second gate electrode 140 may be disposed on the second insulating layer 122. The second gate electrode 140 may overlap the first gate electrode 130 and the semiconductor layer 110. The second gate electrode 140 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The third insulating layer 123 may be disposed on the second gate electrode 140. The third insulating layer 123 may be formed of an inorganic layer, for example, a silicon nitride layer, a silicon oxynitride layer, a silicon oxide layer, a titanium oxide layer, or an aluminum oxide layer.

A source electrode 151 (or a drain electrode) and a drain electrode 152 (or a source electrode) of the thin film transistor TFT may be disposed on the third insulating layer 123, and a second signal line 155 may be disposed on the third insulating layer 123 to be spaced apart from the source electrode 151 and the drain electrode 152. The source electrode 151 and the drain electrode 152 may be electrically connected to the semiconductor layer 110 through contact holes passing through the third insulating layer 123, the second insulating layer 122 and the first insulating layer 121. The second signal line 155 may be a scan line. The source electrode 151, the drain electrode 152 and the second signal line 155 may be formed of a single layer or multiple layers made of a low resistance material, for example, any one of aluminum (Al), gold (Au), and copper (Cu) or an alloy thereof.

A first via layer VIA1 may be disposed on the source electrode 151, the drain electrode 152 and the second signal line 155. The first via layer VIA1 may be a planarization layer for flattening a step due to the thin film transistor TFT. The first via layer VIA1 may include an organic insulating material selected from the group consisting of acrylic resin, epoxy resin, phenolic resin, polyamide resin, polyimide resin, unsaturated polyester resin, polyphenylene resin, polyphenylenesulfide resin, benzocyclobutene (BCB), or a combination thereof.

A connection electrode 162 and a third signal line 164 may be disposed on the first via layer VIA1. The connection electrode 162 may be disposed on the first via layer VIA1 to electrically connect the drain electrode 152 (or source electrode) to a pixel electrode PXE. The connection electrode 162 may be electrically connected to the drain electrode 152 (or source electrode) through a contact hole formed in the first via layer VIAL The third signal line 164 may be a data line (DTL of FIG. 1) and/or a first power line (ELVDL of FIG. 1). The connection electrode 162 and the third signal line 164 may be formed of a single layer or multiple layers made of a low resistance material, for example, any one of aluminum (Al), gold (Au), and copper (Cu) or an alloy thereof.

The second via layer VIA2 may be disposed on the connection electrode 162 and the third signal line 164. The second via layer VIA2 may be a planarization layer for insulating the connection electrode 162 and the third signal line 164 and flattening a stepped portion at the lower side. The second via layer VIA2 may include an organic insulating material selected from the group consisting of acrylic resin, epoxy resin, phenolic resin, polyamide resin, polyimide resin, unsaturated polyester resin, polyphenylene resin, polyphenylenesulfide resin, benzocyclobutene (BCB), or a combination thereof.

In an embodiment, the second signal line 155 and the third signal line 164 may be formed on different layers by forming the first via layer VIA1 and the second via layer VIA2. A signal delay may be prevented by forming the second signal line 155 and the third signal line 164 as a separate layer of a low resistance material such as aluminum.

The light emitting element EMD may be disposed on the second via layer VIA2. The light emitting element EMD may be disposed in the display area DPA. The light emitting element EMD may include a pixel electrode PXE, a light emitting layer EML, and a common electrode CME.

Specifically, the pixel electrode PXE may be disposed on the second via layer VIA2. The pixel electrode PXE may be a first electrode (e.g., an anode electrode) of the light emitting element EMD. The pixel electrode PXE may be electrically connected to the connection electrode 162 through a contact hole passing through the second via layer VIA2 and may be electrically connected to the drain electrode 152 (or source electrode) of the thin film transistor TFT.

In a top emission type structure that may emit light toward the common electrode CME with respect to the light emitting layer EML, the pixel electrode PXE may be formed of a single layer of silver (Ag), molybdenum (Mo), titanium (Ti), copper (Cu), or aluminum (Al), or may be formed of a metal material having high reflectivity to have a stacked structure (Ti/Al/Ti) of aluminum and titanium, a stacked structure (ITO/Ag/ITO) of silver and ITO, an APC alloy, or a stacked structure (ITO/APC/ITO) of an APC alloy and ITO. The APC alloy may be an alloy of silver (Ag), palladium (Pd) and copper (Cu).

As another example, in a bottom emission type structure that may emit light toward the pixel electrode PXE with respect to the light emitting layer EML, the pixel electrode PXE may be formed of a transparent metal material (transparent conductive material, TCO), such as indium tin oxide (ITO) or indium zinc oxide (IZO), capable of transmitting light therethrough, or a semi-transmissive metal material (semi-transmissive conductive material) such as magnesium (Mg), silver (Ag), or an alloy of magnesium (Mg) and silver (Ag). In case that the pixel electrode PXE is formed of a semi-transmissive metal material, the light emission efficiency can be increased due to a micro-cavity effect.

A pixel defining layer PDL may be disposed on the pixel electrode PXE. The pixel defining layer PDL may be disposed on the pixel electrode PXE and may include an opening to expose the pixel electrode PXE. The pixel defining layer PDL may include an organic insulating material selected from the group consisting of acrylic resin, epoxy resin, phenolic resin, polyamide resin, polyimide resin, unsaturated polyester resin, polyphenylene resin, polyphenylenesulfide resin, benzocyclobutene (BCB), or a combination thereof.

A spacer 170 may be disposed on the pixel defining layer PDL. The spacer 170 may serve to maintain a gap with a structure disposed on the spacer 170 during a manufacturing process. In an embodiment, the pixel defining layer PDL and the spacer 170 may be formed as one body. An organic material may be coated, and the pixel defining layer PDL and the spacer 170 may be integrally formed using a half-tone mask. However, the embodiment is not limited thereto, and the pixel defining layer PDL and the spacer 170 may be formed separately.

The light emitting layer EML may be disposed on the pixel electrode PXE exposed by the pixel defining layer PDL. The light emitting layer EML may include an organic material layer. The organic material layer of the light emitting layer EML may include an organic light emitting layer, and may further include a hole injecting/transporting layer and/or an electron injecting/transporting layer. In an embodiment, the light emitting layer EML may have a tandem structure in which organic light emitting layers may be superposed in the thickness direction and a charge generation layer may be disposed between the organic light emitting layers. The respective organic light emitting layers superposed may emit light of the same wavelength, or may emit light of different wavelengths. At least some of the layers may be separate from the same layer of neighboring pixels.

The common electrode CME may be disposed on the light emitting layer EML. The common electrode CME may be a second electrode (e.g., a cathode electrode) of the light emitting element EMD. The common electrode CME may be formed commonly to the pixels. In an embodiment, in the top emission type structure, the common electrode CME may be formed of a transparent conductive material (TCO) such as ITO or IZO capable of transmitting light or a semi-transmissive conductive material such as magnesium (Mg), silver (Ag), or an alloy of magnesium (Mg) and silver (Ag). In case that the common electrode CME is formed of a semi-transmissive conductive material, the light emission efficiency can be increased due to a micro-cavity effect.

In the bottom emission type structure, the common electrode CME may be formed of a single layer of aluminum (Al), molybdenum (Mo), titanium (Ti), copper (Cu), or silver (Ag), or may be formed of a metal material having high reflectivity to have a stacked structure (Ti/Al/Ti) of aluminum and titanium, a stacked structure (ITO/Ag/ITO) of silver and ITO, an APC alloy, or a stacked structure (ITO/APC/ITO) of an APC alloy and ITO.

A common electrode contact portion CCA may be disposed in the non-display area NDA of the substrate 101. The common electrode contact portion CCA may be a region where the common electrode CME and the auxiliary electrode APE may be in contact with each other.

Specifically, the second power line 45 may be disposed on the third insulating layer 123 of the substrate 101. The second power line 45 and the source electrode 151 (or the drain electrode) may be disposed on a same layer and may be made of a same material. A portion of the second power line 45 may overlap the first via layer VIAL In an embodiment, the second power line 45 and the source electrode 151 (or the drain electrode) may be disposed on a same layer, but the disclosure is not limited thereto. The second power line 45 and the second gate electrode 140 or the first gate electrode 130 may be disposed on a same layer.

The first via layer VIA1 and the second via layer VIA2 may be sequentially disposed on the third insulating layer 123. The first via layer VIA1 and the second via layer VIA2 may extend from the display area DPA. The first via layer VIA1 and the second via layer VIA2 may be disposed only on a portion of the non-display area NDA. For example, the first via layer VIA1 and the second via layer VIA2 may be disposed in a direction toward the display area DPA with respect to the second power line 45. The first via layer VIA1 and the second via layer VIA2 may not be disposed in a direction of the non-display area NDA beyond the second power line 45. In the embodiment, the first via layer VIA1 and the second via layer VIA2 may be disposed to partially cover the second power line 45, but the disclosure is not limited thereto. The first via layer VIA1 and the second via layer VIA2 may entirely cover the second power line 45 and extend further to the non-display area NDA.

The auxiliary electrode APE may be disposed on the second via layer VIA2. The auxiliary electrode APE and the pixel electrode PXE of the light emitting element EMD may be disposed on a same layer and may include a same material. For example, the auxiliary electrode APE may be made of ITO/Ag/ITO.

The auxiliary electrode APE may extend along side surfaces of the first via layer VIA1 and the second via layer VIA2 and may be electrically connected to the second power line 45. In an embodiment, the auxiliary electrode APE may be in contact (e.g., direct contact) with the second power line 45. In an embodiment, a case where the auxiliary electrode APE extends along side surfaces of the first via layer VIA1 and the second via layer VIA2 and may be electrically connected to the second power line 45 has been illustrated as an example, but the disclosure is not limited thereto. The auxiliary electrode APE may be electrically connected to the second power line 45 through contact holes formed in the first via layer VIA1 and the second via layer VIA2.

The auxiliary electrode APE overlapping the second via layer VIA2 may include electrode holes APH. The electrode holes APH may be through-holes passing through the auxiliary electrode APE. The electrode holes APH may be provided for outgassing in which a part of gas generated by heat treatment during the manufacturing process of the display device may be discharged from the first via layer VIA1 and the second via layer VIA2. The gas generated in the first via layer VIA1 and the second via layer VIA2 may damage the light emitting element EMD by deteriorating the light emitting layer EML or oxidizing the common electrode CME. Therefore, in an embodiment, the auxiliary electrode APE may include the electrode holes APH, thereby preventing damage to the light emitting element EMD.

As shown in FIGS. 4 to 6, an organic layer pattern PDP may be disposed on the auxiliary electrode APE and the second via layer VIA2. The organic layer pattern PDP and the pixel defining layer PDL may be disposed on a same layer and may be formed of a same material. The organic layer pattern PDP may be formed plurally to cover the electrode holes APH of the auxiliary electrode APE. The organic layer pattern PDP may cover an edge of the auxiliary electrode APE, which is may be sidewall of the electrode hole APH. In some embodiments, the auxiliary electrode APE may be formed of ITO/Ag/ITO, and corrosion of silver (Ag) may occur on the side surface of the auxiliary electrode APE due to an etching solution. Therefore, the organic layer pattern PDP may cover the edge of the auxiliary electrode APE adjacent to the electrode hole APH and overlap the edge of the auxiliary electrode APE.

An area PGA between the organic layer patterns PDP which may be spaced apart from each other may overlap the auxiliary electrode APE. The area PGA between the organic layer patterns PDP which may be spaced apart from each other may be smaller than the width of the auxiliary electrode APE disposed between the electrode holes APH. As described above, since the organic layer pattern PDP covers the electrode hole APH and the edge of the auxiliary electrode APE adjacent to the electrode hole APH, the area PGA between the organic layer patterns PDP which may be spaced apart from each other may be smaller than the width of the auxiliary electrode APE.

The common electrode CME may be disposed on the organic layer patterns PDP and the auxiliary electrode APE. The common electrode CME may extend from the display area DPA to the non-display area NDA. The common electrode CME may be electrically connected to the auxiliary electrode APE to prevent a voltage drop of the auxiliary electrode APE and apply a second power voltage.

As illustrated in FIGS. 4 to 6, the common electrode CME may be electrically connected to the auxiliary electrode APE in the area PGA between the organic layer patterns PDP which may be spaced apart from each other. The common electrode CME may be in contact (e.g., direct contact) with the auxiliary electrode APE (e.g., upper surface of the auxiliary electrode APE) along side surfaces of the organic layer patterns PDP. The common electrode CME may be in contact with the auxiliary electrode APE at multiple points, for example, in the areas PGA between the organic layer patterns PDP which may be spaced apart from each other, thereby lowering the contact resistance between the common electrode CME and the auxiliary electrode APE. The outer side surface of the common electrode CME may be disposed on the organic layer pattern PDP and may overlap the organic layer pattern PDP.

As described above, the display device 1' illustrated in FIGS. 4 to 6 may include two via layers, for example, the first via layer VIA1 and the second via layer VIA2, to form the low resistance third signal line 164. The first via layer VIA1 and the second via layer VIA2 may have a large amount of outgassing. The organic layer pattern PDP disposed below the common electrode CME may also generate outgassing. Therefore, due to an increase in the amount of outgassing generated from the first via layer VIA1, the second via layer VIA2 and the organic layer patterns PDP, the common electrode CME may be oxidized and a display failure may occur.

Hereinafter, a display device capable of preventing a display failure due to oxidation of the common electrode by reducing the amount of outgassing will be described.

Figure 7:
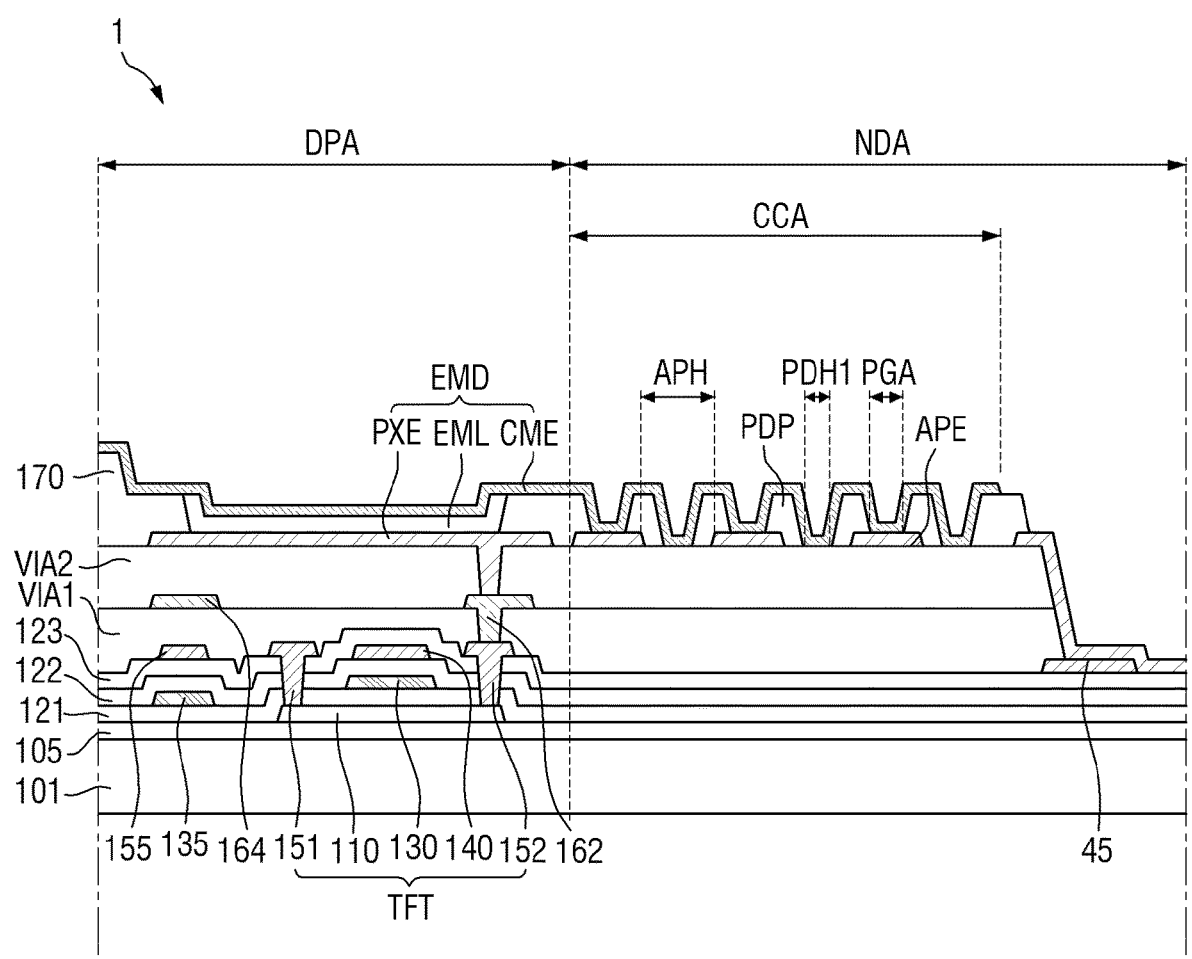
FIG. 7 is a view schematically showing a cross-sectional structure taken along cutting line I-I' of FIG. 3 according to an embodiment.
Figure 8:
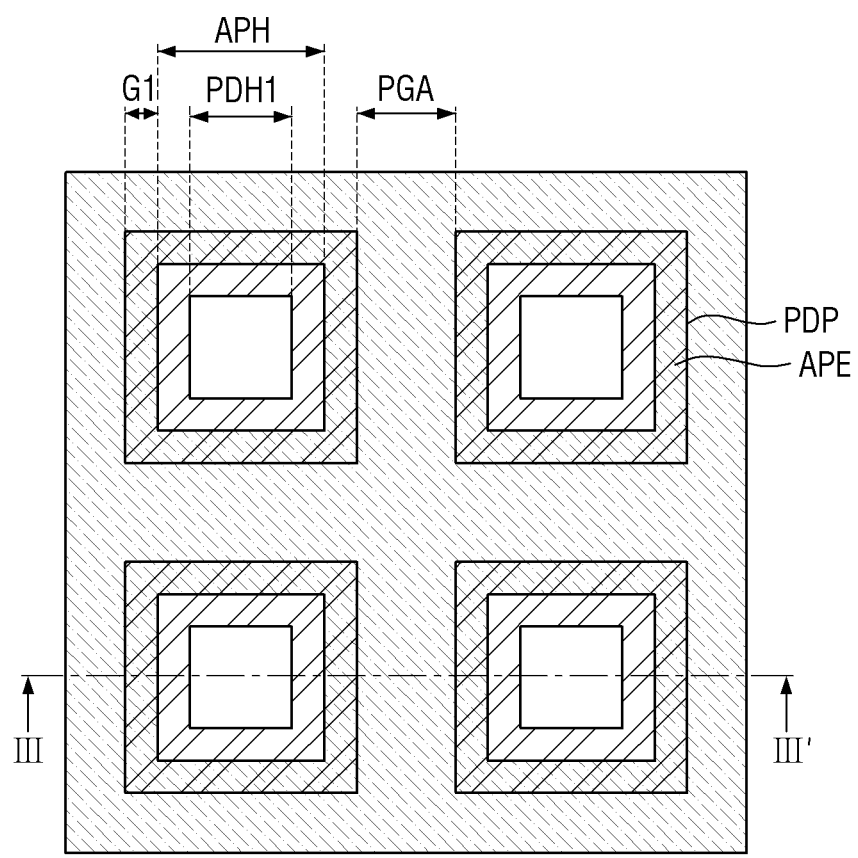
FIG. 8 is a plan view schematically illustrating a common electrode contact portion of FIG. 7.
Figure 9:
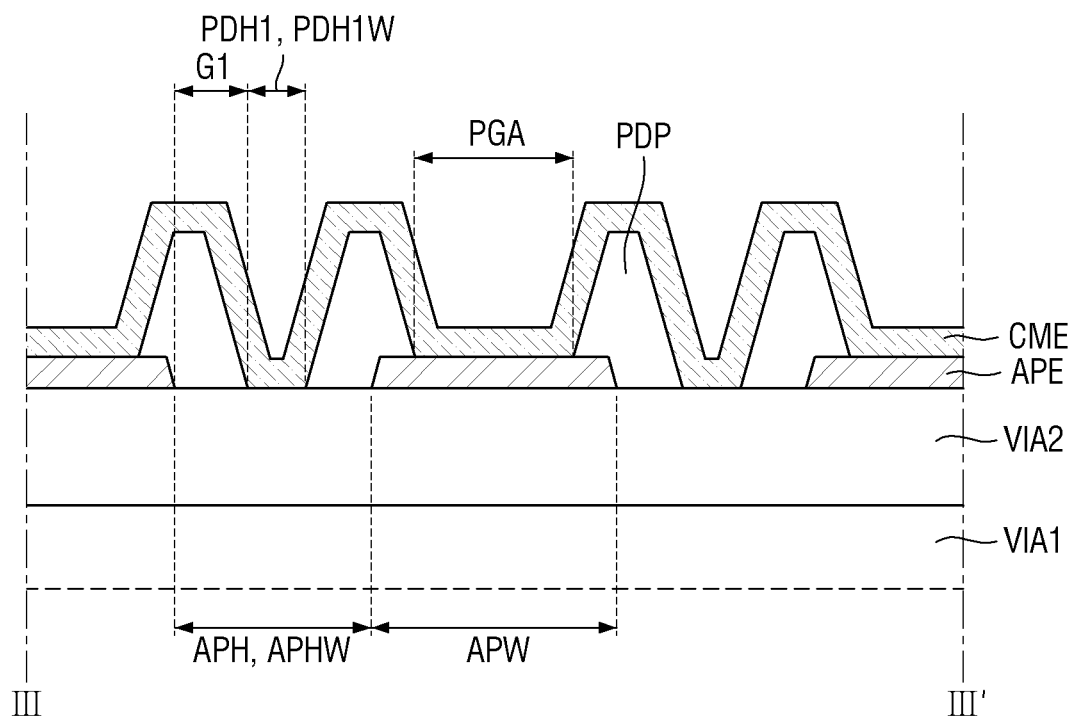
FIG. 9 is a view schematically showing a cross-sectional structure taken along cutting line III-III' of FIG. 8.

FIG. 7 is a view schematically showing a cross-sectional structure taken along cutting line I-I' of FIG. 3 according to an embodiment. FIG. 8 is a plan view schematically illustrating a common electrode contact portion of FIG. 7. FIG. 9 is a view schematically showing a cross-sectional structure taken along cutting line III-III' of FIG. 8.

Referring to FIGS. 7 to 9, the display device 1 according to the embodiment may include the auxiliary electrode APE, the organic layer pattern PDP and the common electrode CME in the common electrode contact portion CCA. In particular, the embodiment has a difference from the above-described embodiment of FIGS. 4 to 6 in that a pattern hole overlapping the electrode hole APH may be formed in the organic layer pattern PDP, and the other configurations may be substantially the same or similar. Thus, a redundant description will be omitted and differences will be described.

As illustrated in FIGS. 7 to 9, the auxiliary electrode APE may be disposed on the second via layer VIA2 of the non-display area NDA. Electrode holes APH may be formed in the auxiliary electrode APE.

Organic layer patterns PDP may be disposed on the auxiliary electrode APE to overlap the electrode holes APH and cover the electrode holes APH of the auxiliary electrode APE. The organic layer pattern PDP may cover the edge of the auxiliary electrode APE adjacent to the electrode hole APH and overlap the edge of the auxiliary electrode APE.

In an embodiment, the organic layer patterns PDPs may be spaced apart from each other, and the area PGA between the organic layer patterns PDPs which may be spaced apart from each other may overlap the auxiliary electrode APE. The area PGA between the organic layer patterns PDP which may be spaced apart from each other may be smaller than a width APW of the auxiliary electrode APE disposed between the electrode holes APH.

As illustrated in FIGS. 7 to 9, the organic layer pattern PDP may include a pattern hole PDH1 overlapping the electrode hole APH of the auxiliary electrode APE. The pattern hole PDH1 may pass through the organic layer pattern PDP to expose the second via layer VIA2 (e.g., upper surface of the second via layer VIA2) disposed below the organic layer pattern PDP. The pattern hole PDH1 may overlap the electrode hole APH but may not overlap the auxiliary electrode APE.

In an embodiment, the pattern hole PDH1 of the organic layer pattern PDP may be obtained by removing a portion of the organic layer pattern PDP to reduce total volume of the organic layer pattern PDP. In case that the total volume of the organic layer pattern PDP is reduced, the amount of outgassing generated from the organic layer pattern PDP can be reduced to prevent a display failure due to oxidation of the common electrode CME.

The pattern hole PDH1 of the organic layer pattern PDP may be spaced apart from the adjacent auxiliary electrode APE and may not overlap the auxiliary electrode APE. A width PDH1W of the pattern hole PDH1 of the organic layer pattern PDP may be smaller than a width APHW of the electrode hole APH of the auxiliary electrode APE. As described above, in case that the side surface of the auxiliary electrode APE is exposed, corrosion of Ag may occur on the side surface of the auxiliary electrode APE due to an etching solution. In order to prevent corrosion of Ag, the organic layer pattern PDP may cover the edge of the auxiliary electrode APE adjacent to the electrode hole APH. Therefore, the width PDH1W of the pattern hole PDH1 of the organic layer pattern PDP may be smaller than the width APHW of the electrode hole APH of the auxiliary electrode APE.

In an embodiment, a side surface of the organic layer pattern PDP, for example, a side surface of the organic layer pattern PDP forming a sidewall of the pattern hole PDH1, and a side surface of the auxiliary electrode APE may have a first gap G1. The first gap G1 between a side surface of the organic layer pattern PDP and a side surface of the auxiliary electrode APE may be at least about 4 Another side surface of the organic layer pattern PDP, for example, another side surface of the organic layer pattern PDP overlapping the auxiliary electrode APE and a side surface of the auxiliary electrode APE may have a second gap G2. The second gap G2 between the another side surface of the organic layer pattern PDP and a side surface of the auxiliary electrode APE may be at least about 4 µm. As described above, in order for the organic layer pattern PDP to cover the side surface of the auxiliary electrode APE, the organic layer pattern PDP may be formed to have the gaps G1 and G2 of at least about 4 µm from one side surface of the auxiliary electrode APE. In an embodiment, the width of the organic layer pattern PDP may be at least about 8 µm.

In an embodiment, the planar shape of the organic layer pattern PDP may have a shape surrounding the electrode hole APH of the auxiliary electrode APE. For example, the planar shape of the organic layer pattern PDP may have a closed loop shape. Although FIG. 8 illustrates that the planar shape of the organic layer pattern PDP may be a quadrangular closed loop shape, the disclosure is not limited thereto. The planar shape of the organic layer pattern PDP may be a circular shape, or a triangular or more polygonal shape. The planar shape of the organic layer pattern PDP of an embodiment may be any shape as long as it may be similar to the planar shape of the electrode hole APH of the auxiliary electrode APE.

In an embodiment, the planar shape of the pattern hole PDH1 of the organic layer pattern PDP may have a quadrangular shape similar to the planar shape of the organic layer pattern PDP. The pattern hole PDH1 of the organic layer pattern PDP may be formed as large as possible if the organic layer pattern PDP can cover at least the edge of the auxiliary electrode APE. Therefore, the planar shape of the pattern hole PDH1 may have a quadrangular shape similar to the planar shape of the organic layer pattern PDP. Although FIG. 8 illustrates that the planar shape of the pattern hole PDH1 of the organic layer pattern PDP may be quadrangular, the disclosure is not limited thereto. The planar shape of the pattern hole PDH1 of the organic layer pattern PDP may be a circular shape, or a triangular or more polygonal shape.

As illustrated in FIGS. 7 to 9, the pattern holes PDH1 of the organic layer patterns PDP may correspond to the electrode holes APH of the auxiliary electrode APE in a one-to-one manner. However, the number of the pattern holes PDH1 of the organic layer patterns PDP may be two or more if they overlap the electrode holes APH of the auxiliary electrode APE.

In an embodiment, the organic layer pattern PDP may be in contact (e.g., direct contact) with the auxiliary electrode APE (e.g., upper surface of the auxiliary electrode APE) overlapping the organic layer pattern PDP and the second via layer VIA2 (e.g., upper surface of the second via layer VIA2) in a region overlapping the electrode hole APH. For example, the organic layer pattern PDP may be in contact with the upper surface of the second via layer VIA2 exposed by the electrode hole APH through the electrode hole APH.

As illustrated in FIGS. 7 to 9, the common electrode CME may be disposed on the organic layer patterns PDP and the auxiliary electrode APE. The common electrode CME may be electrically connected to the auxiliary electrode APE in the area PGA between the organic layer patterns PDP which may be spaced apart from each other. The common electrode CME may be in contact (e.g., direct contact) with the auxiliary electrode APE (e.g., upper surface of the auxiliary electrode APE) along side surfaces of the organic layer patterns PDP.

In an embodiment, the common electrode CME may be in contact (e.g., direct contact) with the second via layer VIA2 (e.g., upper surface of the second via layer VIA2) exposed by the pattern hole PDH1 of the organic layer pattern PDP. In an embodiment, the common electrode CME may extend along the side surface of the pattern hole PDH1 of the organic layer pattern PDP in contact therewith to be in contact (e.g., direct contact) with the upper surface of the second via layer VIA2.

As described above, the display device according to an embodiment can reduce the total volume of the organic layer pattern PDP by forming the pattern hole PDH1 of the organic layer pattern PDP overlapping the electrode hole APH. Therefore, it may be possible to prevent oxidation of the common electrode CME and to prevent a display failure by reducing the amount of outgassing generated from the organic layer pattern PDP.

Figure 10:
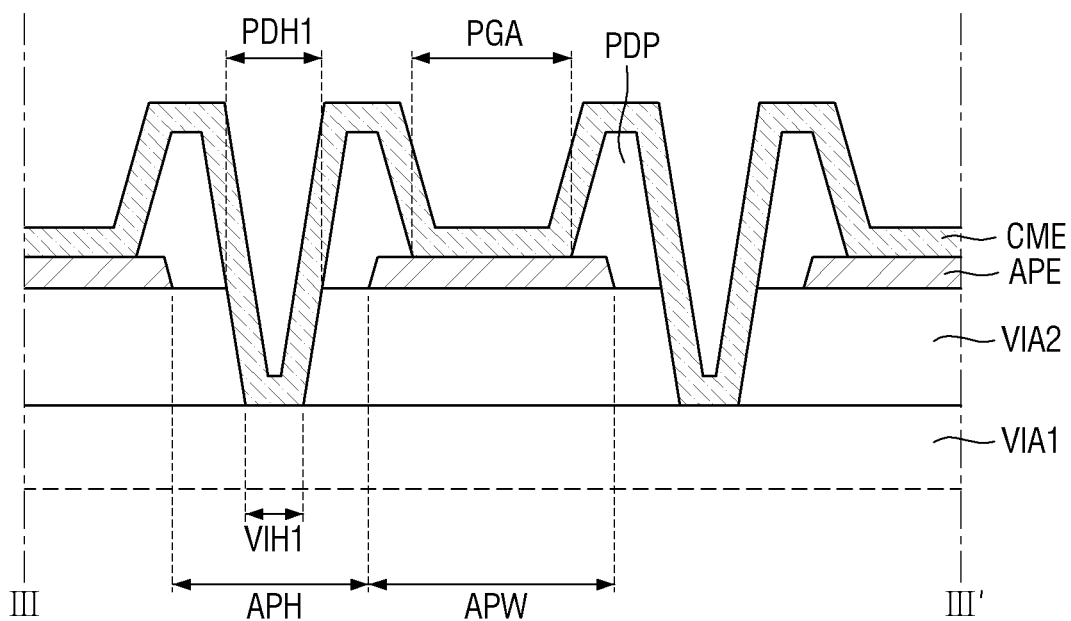
FIGS. 10 and 11 are cross-sectional views schematically showing a display device of another embodiment, taken along cutting line III-III' of FIG. 8.
Figure 11:
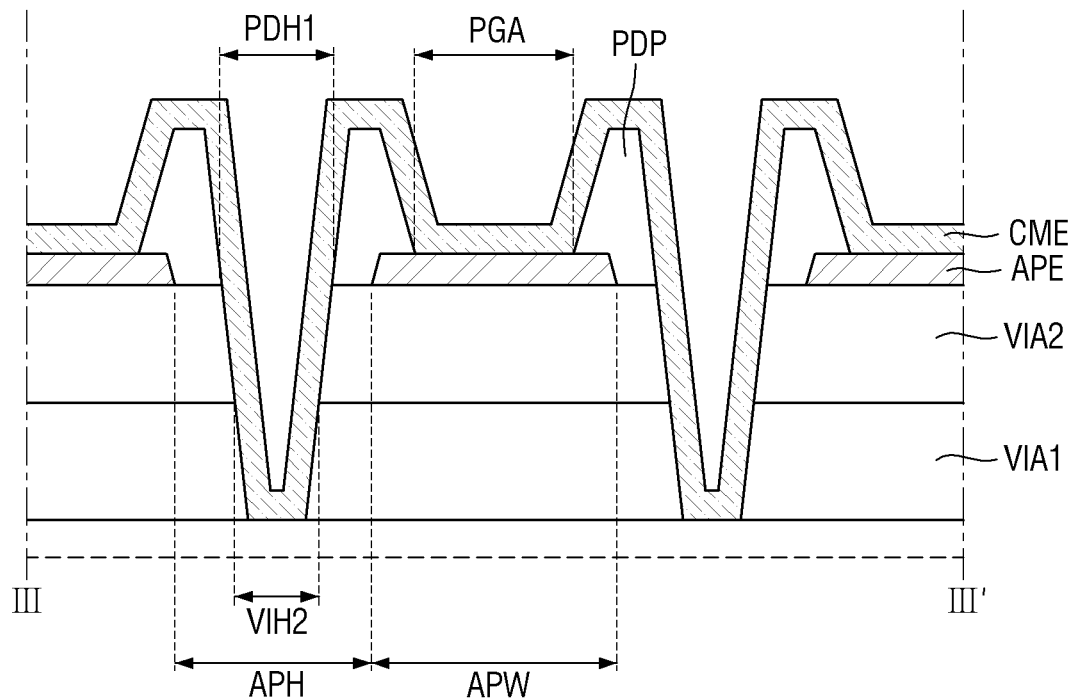

FIGS. 10 and 11 are cross-sectional views schematically showing a display device of another embodiment, taken along cutting line III-III' of FIG. 8.

Referring to FIGS. 10 and 11, the display device 1 according to the embodiment may include the first via layer VIA1, the second via layer VIA2, the auxiliary electrode APE, the organic layer pattern PDP, and the common electrode CME. In particular, the embodiment of FIG. 10 may have a difference from the above-described embodiment of FIGS. 7 to 9 in that a first via hole VIH1 may be formed in the second via layer VIA2. Further, the embodiment of FIG. 11 may have a difference from the embodiments of FIGS. 7 to 10 in that a second via hole VIH2 may be formed in the first via layer VIA1 and the first via hole VIH1 may be formed in the second via layer VIA2. The other configurations may be substantially the same or similar. Thus, a redundant description will be omitted and differences will be described.

Referring to FIG. 10, the display device according to an embodiment may include the first via hole VIH1 in the second via layer VIA2. The first via hole VIH1 may overlap the electrode hole APH of the auxiliary electrode APE and the pattern hole PDH1 of the organic layer pattern PDP. In an embodiment, the first via hole VIH1 may be formed continuously with the pattern hole PDH1 of the organic layer pattern PDP. For example, the side surface of the first via hole VIH1 may be aligned with and coincide with the side surface of the pattern hole PDH1 of the organic layer pattern PDP.

As described above, the second via layer VIA2 may be a layer in which outgassing occurs. In the embodiment, by forming the first via hole VIH1 in the second via layer VIA2, the volume of the second via layer VIA2 can be reduced to reduce the amount of outgassing generated in the second via layer VIA2.

In an embodiment, the common electrode CME may extend along the side surface of the pattern hole PDH1 of the organic layer pattern PDP in contact therewith to be in contact with the side surface of the first via hole VIH1 of the second via layer VIA2. The common electrode CME may be in contact (e.g., direct contact) with the first via layer VIA1 (e.g., upper surface of the first via layer VIA1) exposed by the first via hole VIH1.

Referring to FIG. 11, the second via layer VIA2 may include the first via hole VIA1, and the first via layer VIA1 may include the second via hole VIA2. The second via hole VIH2 may overlap the electrode hole APH of the auxiliary electrode APE, the pattern hole PDH1 of the organic layer pattern PDP, and the first via hole VIA1 of the second via layer VIA2. In an embodiment, the second via hole VIH2 may be formed continuously with the first via hole VIA1 of the second via layer VIA2. For example, the side surface of the second via hole VIH2 may be aligned with and coincide with the side surface of the first via hole VIH1.

As described above, the first via layer VIA1 may be a layer in which outgassing occurs. In the embodiment, the first via hole VIH1 may be formed in the second via layer VIA2 and the second via hole VIH2 may be formed in the first via layer VIA1, and thus, the amount of outgassing generated from the first via layer VIA1 and the second via layer VIA2 can be reduced by reducing the volume of the first via layer VIA1 and the second via layer VIA2.

In an embodiment, the common electrode CME may extend along the side surface of the pattern hole PDH1 of the organic layer pattern PDP in contact therewith to be in contact with the side surface of the first via hole VIH1 of the second via layer VIA2. Further, the common electrode CME may be in contact (e.g., direct contact) with the third insulating layer (e.g., upper surface of the third insulating layer 123) exposed by the second via hole VIH2 in contact with the side surface of the second via hole VIH2 of the first via layer VIA1.

Figure 12:
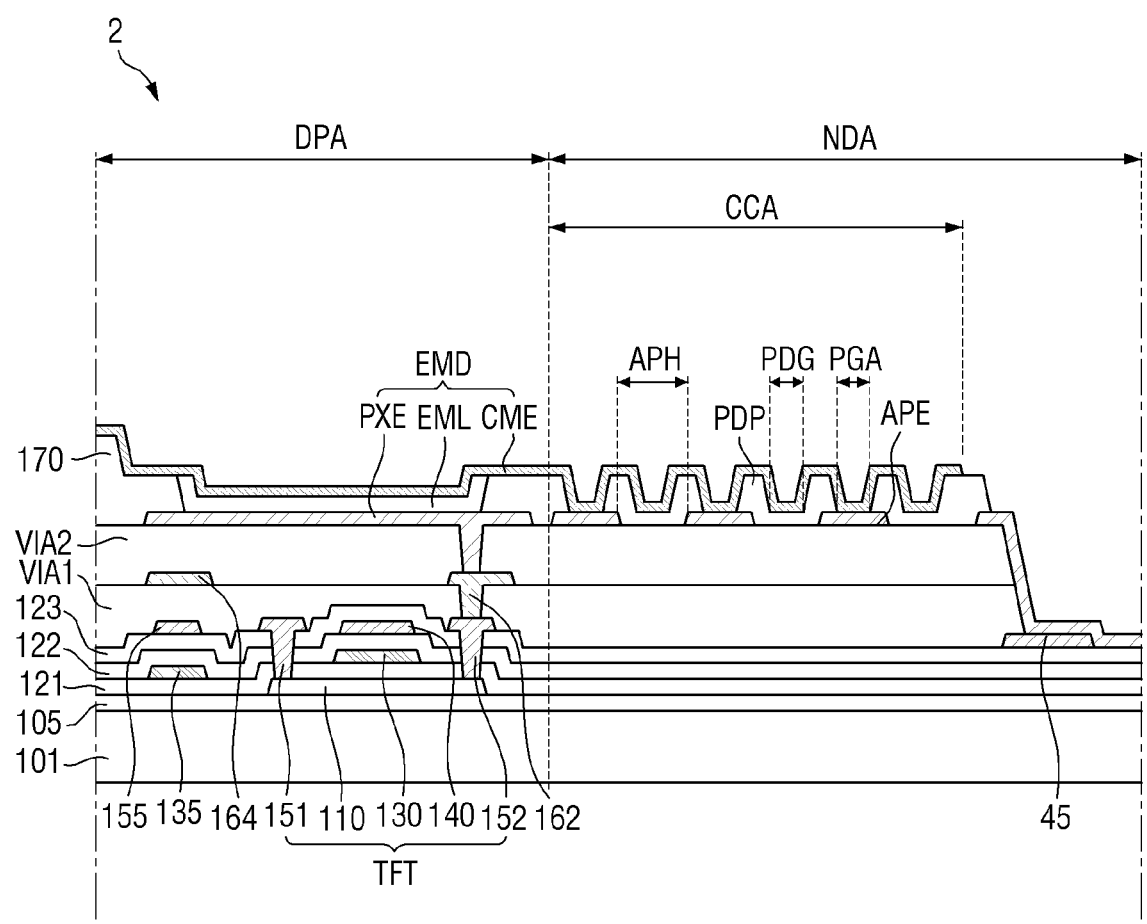
FIG. 12 is a cross-sectional view schematically showing a display device according to another embodiment, taken along cutting line I-I' of FIG. 3.
Figure 13:
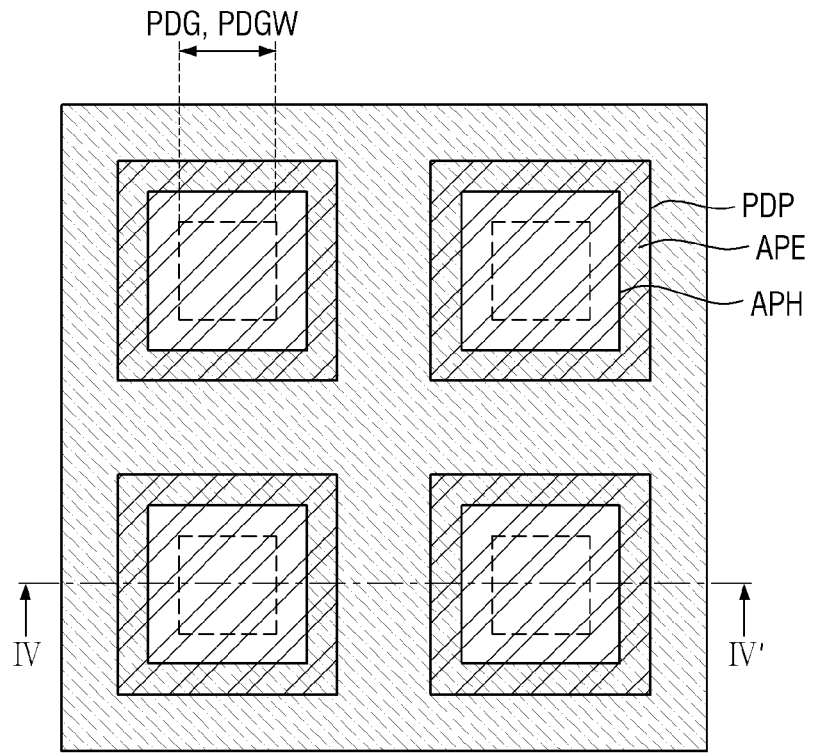
FIG. 13 is a plan view schematically illustrating a common electrode contact portion of FIG. 12.
Figure 14:
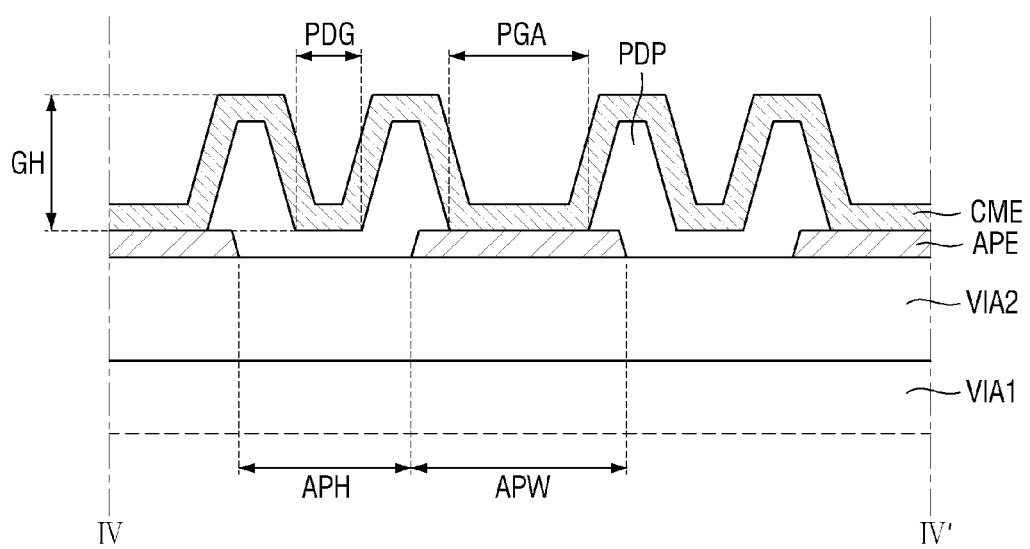
FIG. 14 is a view schematically showing a cross-sectional structure taken along cutting line IV-IV' of FIG. 13.

FIG. 12 is a cross-sectional view schematically showing a display device according to another embodiment, taken along cutting line I-I' of FIG. 3. FIG. 13 is a plan view schematically illustrating a common electrode contact portion of FIG. 12. FIG. 14 is a view schematically showing a cross-sectional structure taken along cutting line IV-IV' of FIG. 13.

Referring to FIGS. 12 to 14, the display device 2 according to an embodiment may include the auxiliary electrode APE, the organic layer pattern PDP and the common electrode CME in the common electrode contact portion CCA. In particular, the embodiment has a difference from the embodiments of FIGS. 4 to 11 in that the organic layer pattern PDP has therein a pattern groove which overlaps the electrode hole APH, and the other configurations may be substantially the same or similar. Thus, a redundant description will be omitted and differences will be described.

As illustrated in FIGS. 12 to 14, the organic layer pattern PDP may include a pattern groove PDG overlapping the electrode hole APH of the auxiliary electrode APE. The pattern groove PDG may be a concave groove having a depth from the surface of the organic layer pattern PDP.

In an embodiment, the pattern groove PDG of the organic layer pattern PDP may be obtained by removing a portion of the organic layer pattern PDP to reduce the volume of the organic layer pattern PDP. In case that the volume of the organic layer pattern PDP may be reduced, the amount of outgassing generated in the organic layer pattern PDP may be reduced to prevent a display failure due to oxidation of the common electrode CME.

In the pattern groove PDG of the organic layer pattern PDP, since the organic layer pattern PDP may not be completely removed, the organic layer pattern PDP may entirely cover the electrode hole APH. The pattern groove PDG of the organic layer pattern PDP may not overlap the adjacent auxiliary electrode APE. A width PDGW of the pattern groove PDG of the organic layer pattern PDP may be equal to or smaller than the width APHW of the electrode hole APH of the auxiliary electrode APE. Since the pattern groove PDG does not expose the side surface of the auxiliary electrode APE, the pattern groove PDG may have the same width as that of the electrode hole APH of the auxiliary electrode APE. However, the embodiment is not limited thereto, and since the organic layer pattern PDP may cover the side surface of the auxiliary electrode APE, the width PDGW of the pattern groove PDG may be larger than the width APHW of the electrode hole APH.

In an embodiment, the pattern groove PDG of the organic layer pattern PDP may have a depth GH. The depth GH of the pattern groove PDG may have any depth GH as long as the second via layer VIA2 located therebelow may not be exposed. In an embodiment, the depth GH of the pattern groove PDG may be disposed on the same line as the auxiliary electrode APE (e.g., upper surface of the auxiliary electrode APE), thereby forming the pattern groove PDG with the same exposure amount in a process of forming the organic layer pattern PDP, which may be advantageous in the process.

In an embodiment, the planar shape of the pattern groove PDG of the organic layer pattern PDP may have a quadrangular shape similar to the planar shape of the organic layer pattern PDP. Although FIG. 13 illustrates that the planar shape of the pattern groove PDG of the organic layer pattern PDP may be quadrangular, the disclosure is not limited thereto. The planar shape of the pattern groove PDG of the organic layer pattern PDP may be a circular shape, or a triangular or more polygonal shape.

As illustrated in FIGS. 12 to 14, the pattern grooves PDG of the organic layer patterns PDP may correspond to the electrode holes APH of the auxiliary electrode APE in a one-to-one manner. However, the number of the pattern grooves PDG of the organic layer patterns PDP may be two or more if they overlap the electrode holes APH of the auxiliary electrode APE.

As illustrated in FIGS. 12 and 14, the common electrode CME may be disposed on the pattern groove PDG of the organic layer pattern PDP. In an embodiment, the common electrode CME may be in contact (e.g., direct contact) with the side and bottom surfaces of the pattern groove PDG.

As described above, the display device according to an embodiment can reduce the volume of the organic layer pattern PDP by forming the pattern groove PDG of the organic layer pattern PDP overlapping the electrode hole APH. Therefore, it may be possible to prevent oxidation of the common electrode CME and to prevent a display failure by reducing the amount of outgassing generated from the organic layer pattern PDP.

Figure 15:
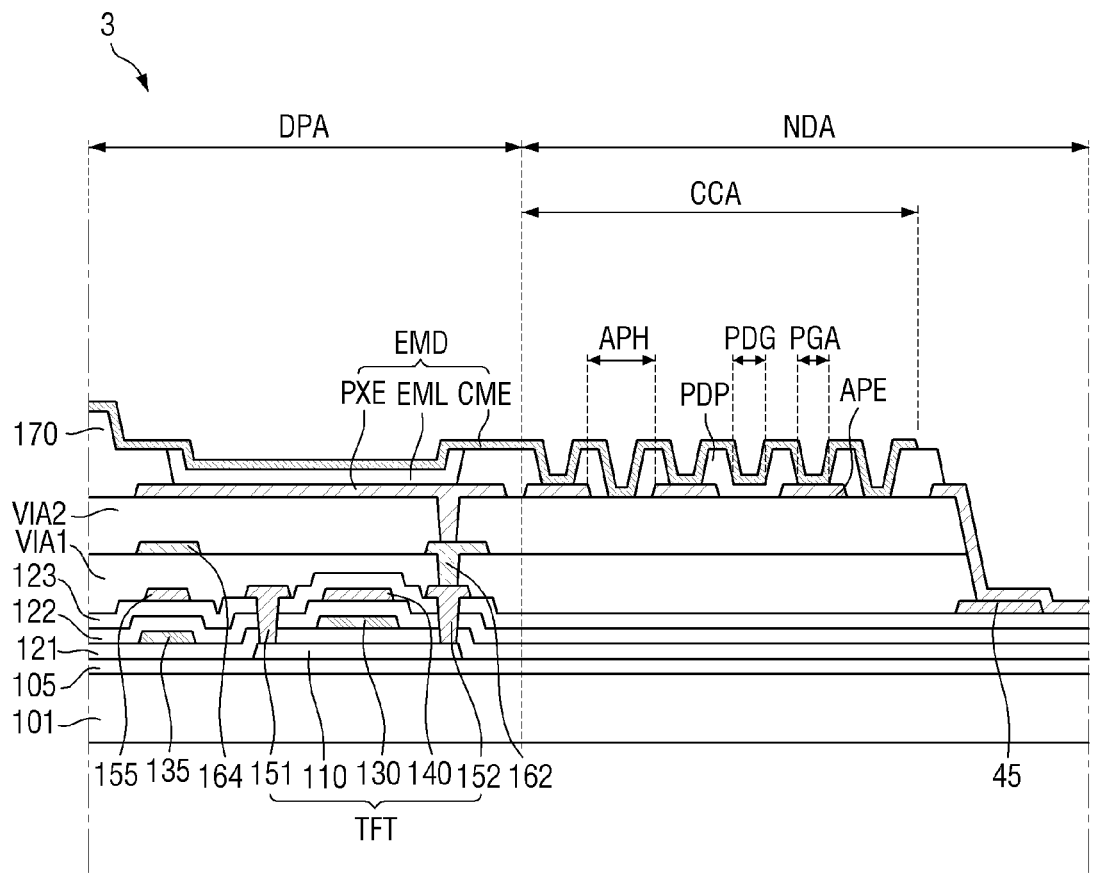
FIG. 15 is a cross-sectional view schematically showing a display device according to another embodiment, taken along cutting line I-I' of FIG. 3.
Figure 16:
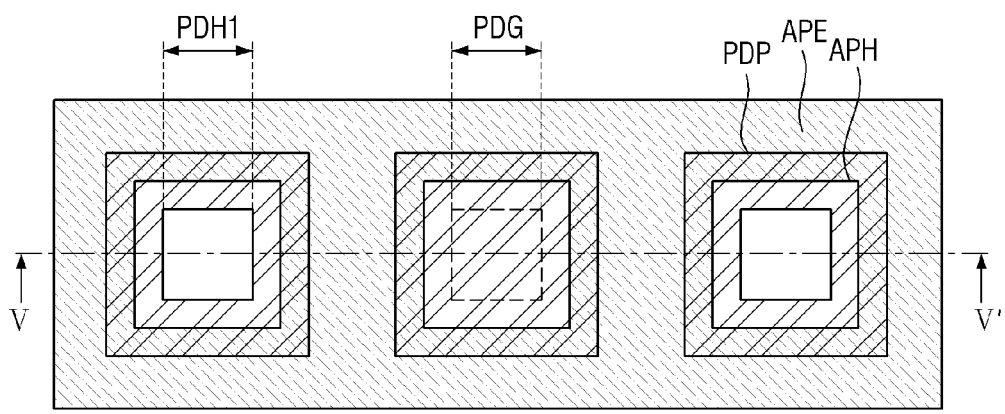
FIG. 16 is a plan view schematically illustrating a common electrode contact portion of FIG. 15.
Figure 17:
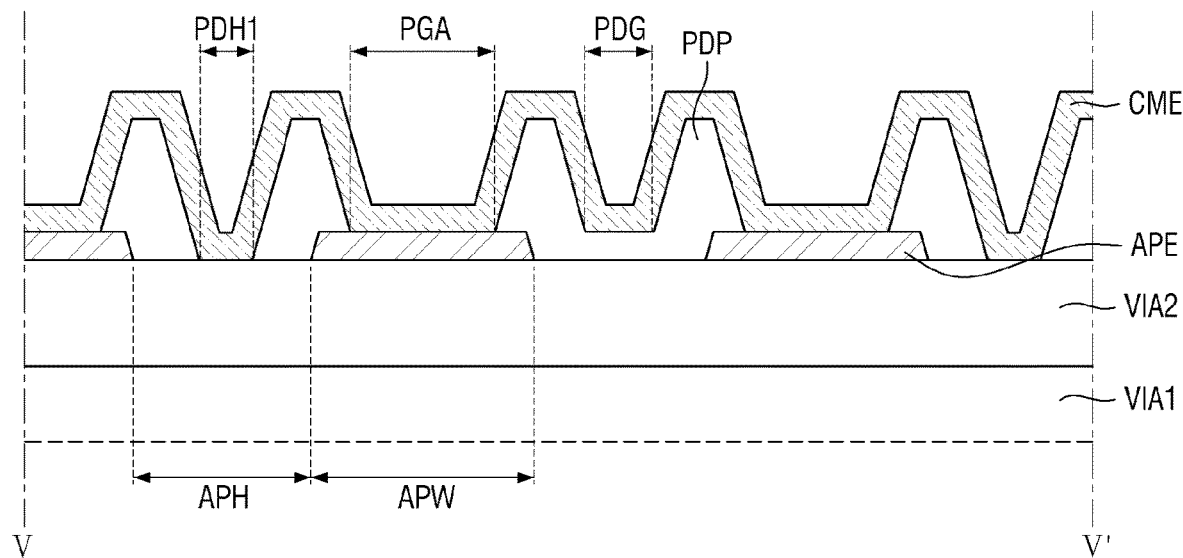
FIG. 17 is a view schematically showing a cross-sectional structure taken along cutting line V-V' of FIG. 16.
Figure 18:
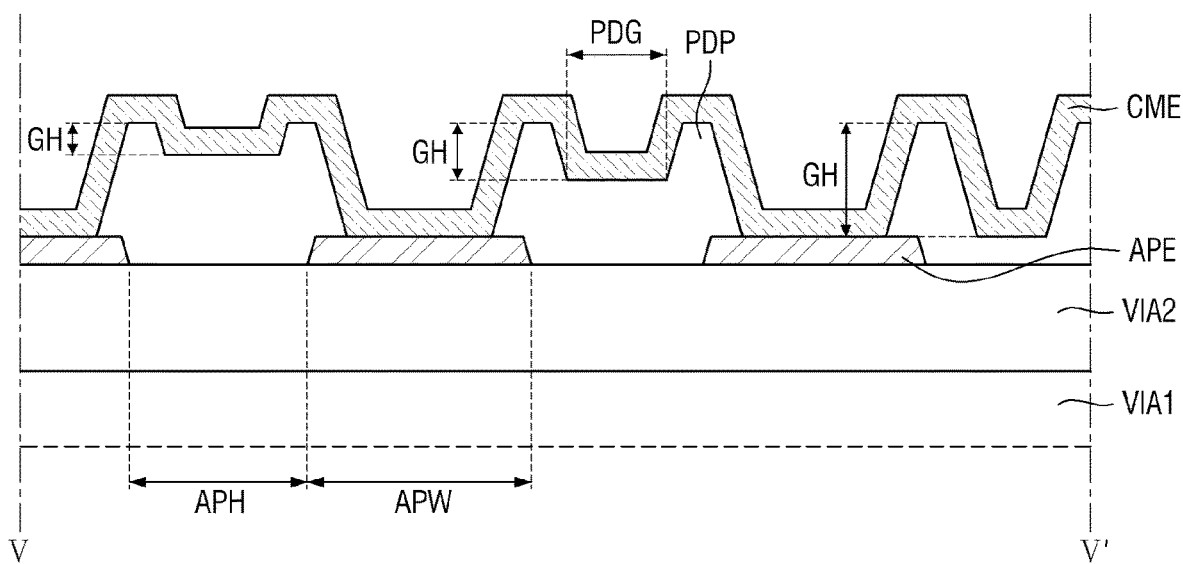
FIGS. 18 and 19 are views schematically showing a cross-sectional structure according to another embodiment, taken along cutting line V-V' of FIG. 16.
Figure 19:
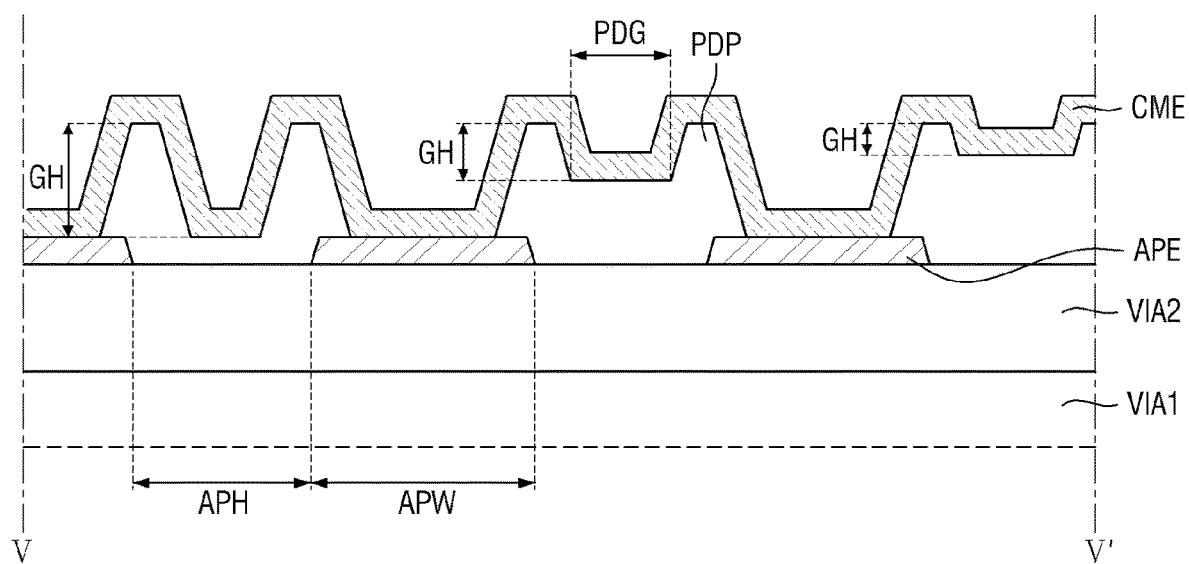

FIG. 15 is a cross-sectional view schematically showing a display device according to another embodiment, taken along cutting line I-I' of FIG. 3. FIG. 16 is a plan view schematically illustrating a common electrode contact portion of FIG. 15. FIG. 17 is a view schematically showing a cross-sectional structure taken along cutting line V-V' of FIG. 16. FIGS. 18 and 19 are views schematically showing a cross-sectional structure according to still another embodiment, taken along cutting line V-V' of FIG. 16.

Referring to FIGS. 15 to 17, the display device 3 according to the embodiment may include the auxiliary electrode APE, the organic layer pattern PDP and the common electrode CME in the common electrode contact portion CCA. In particular, the embodiment may have a difference from the embodiments of FIGS. 12 to 14 in that the organic layer pattern PDP has therein a pattern hole and a pattern groove overlapping the electrode hole APH. Each of FIGS. 18 and 19 may have a difference from the aforementioned example of FIG. 17 in that the depths of the pattern grooves may be different from each other. The other configurations may be substantially the same or similar. Thus, a redundant description will be omitted and differences will be described.

As illustrated in FIGS. 15 to 17, the organic layer pattern PDP may include the pattern groove PDG and the pattern hole PDH1 overlapping the electrode hole APH of the auxiliary electrode APE.

In an embodiment, one organic layer pattern PDP may include the pattern groove PDG, and another organic layer pattern PDP may include the pattern hole PDH1. As described above, the pattern groove PDG and the pattern hole PDH1 may be obtained by removing a portion of the organic layer pattern PDP in order to reduce the volume of the organic layer pattern PDP. In case that the volume of the organic layer pattern PDP is reduced, the amount of outgassing generated in the organic layer pattern PDP may be reduced to prevent a display failure due to oxidation of the common electrode CME.

The pattern groove PDG and the pattern hole PDH1 may be spaced apart from each other. The pattern groove PDG may be disposed between the different pattern holes PDH1. In the drawing, a case where the pattern grooves PDG and the pattern holes PDH1 may be alternately arranged one by one has been illustrated. However, an embodiment is not limited thereto, and the pattern grooves PDG and the pattern holes PDH1 may be alternately arranged two by two. Further, the pattern grooves PDG and the pattern holes PDH1 may be alternately arranged regularly, but may be alternately arranged irregularly. For example, one pattern groove PDG may be disposed and two pattern holes PDH1 may be disposed on the same line.

The configuration examples (e.g., width, arrangement relationship, etc.) of each of the pattern groove PDG and the pattern hole PDH1 have been described above, and thus a detailed description thereof will be omitted.

Referring to FIG. 18, in the display device according to still another embodiment, the depths GH of the pattern grooves PDG may be different from each other. For example, the depth GH of the pattern grooves PDG may gradually increase going away from the display area DPA. On the other hand, as shown in FIG. 19, the depth GH of the pattern grooves PDG may gradually increase going closer to the display area DPA. In the embodiment, a case where the depth GH of the pattern grooves PDG gradually changes has been illustrated by way of example, but the disclosure is not limited thereto, and the depth GH of the pattern grooves PDG may vary irregularly.

As described above, according to the display device according to the embodiments, the volume of the organic layers disposed below the common electrode can be reduced to thereby reduce the amount of outgassing generated from the organic layers. Therefore, it may be possible to reduce the oxidation of the common electrode due to outgassing and to prevent the display quality from deteriorating.

While the invention has been particularly illustrated and described with reference to embodiments thereof, it will be understood by those of ordinary skill in the art that various changes in form and detail may be made therein without departing from the spirit and scope of the invention as defined by the following claims, including any equivalents.

The embodiments should be considered in a descriptive sense only and not for purposes of limitation.

What is claimed is:

1. A display device comprising:
a substrate including a display area and a non-display area;
a driving element disposed in the display area;
an inorganic layer disposed on a gate electrode of the driving element;
a first via layer disposed on the inorganic layer and in the non-display area, the first via layer including an organic insulating material;
a second via layer disposed on the first via layer, the second via layer including an organic insulating material;
a pixel electrode disposed on the second via layer and overlapping the display area;
an auxiliary electrode disposed on the second via layer and overlapping the non-display area;
a pixel defining layer disposed on the second via layer and overlapping the pixel electrode;
organic layer patterns disposed on the second via layer and overlapping the auxiliary electrode;
a light emitting layer disposed on the pixel electrode; and
a common electrode disposed on the light emitting layer and the auxiliary electrode, the common electrode being electrically connected to the auxiliary electrode, wherein
the auxiliary electrode includes electrode holes, and
at least one of the organic layer patterns includes a pattern hole overlapping at least one of the electrode holes.

2. The display device of claim 1, wherein
the electrode holes are through-holes passing through the auxiliary electrode, and
the pattern hole is a through-hole passing through a corresponding one of the organic layer patterns.

3. The display device of claim 1, wherein at least one of the organic layer patterns surrounds at least one of the electrode holes, overlaps the auxiliary electrode adjacent to the electrode hole, and contacts the auxiliary electrode.

4. The display device of claim 3, wherein at least one of the organic layer patterns overlaps at least one of the electrode holes, and contacts the second via layer through the electrode hole.

5. The display device of claim 1, wherein the pattern hole overlaps the electrode hole and does not overlap the auxiliary electrode.

6. The display device of claim 1, wherein the common electrode is in contact with the second via layer through the pattern hole.

7. The display device of claim 1, wherein
an area between the organic layer patterns spaced apart from each other overlaps the auxiliary electrode, and
the common electrode is in contact with the auxiliary electrode through the area between the organic layer patterns spaced apart from each other.

8. The display device of claim 1, wherein
the second via layer includes a first via hole overlapping the electrode hole and the pattern hole, and
a side surface of the first via hole is aligned with a side surface of the pattern hole.

9. The display device of claim 8, wherein the common electrode is in contact with the first via layer through the pattern hole and the first via hole.

10. The display device of claim 8, wherein
the first via layer includes a second via hole overlapping the electrode hole, the pattern hole and the first via hole.

11. The display device of claim 10, wherein a side surface of the second via hole is aligned with a side surface of the first via hole.

12. The display device of claim 10, wherein the common electrode is in contact with the insulating layer through the pattern hole, the first via hole and the second via hole.

13. The display device of claim 1, wherein a planar shape of the organic layer patterns is a closed loop shape.

14. The display device of claim 1, wherein the organic layer patterns and the pixel defining layer are disposed on a same layer and include a same material.

15. The display device of claim 1, wherein the auxiliary electrode and the pixel electrode are disposed on a same layer and include a same material.

16. The display device of claim 1, wherein at least another one of the organic layer patterns includes a pattern groove overlapping at least another one of the electrode holes.

17. A display device comprising:
- a substrate including a display area and a non-display area;
- a driving element disposed in the display area;
- a first via layer disposed on the driving element and in the non-display area;
- a second via layer disposed on the first via layer;
- a pixel electrode disposed on the second via layer and overlapping the display area;
- an auxiliary electrode disposed on the second via layer and overlapping the non-display area;
- a pixel defining layer disposed on the second via layer and overlapping the pixel electrode;
- organic layer patterns disposed on the second via layer and overlapping the auxiliary electrode;
- a light emitting layer disposed on the pixel electrode; and
- a common electrode disposed on the light emitting layer and the auxiliary electrode, the common electrode being electrically connected to the auxiliary electrode, wherein the auxiliary electrode includes electrode holes, and at least one of the organic layer patterns includes a pattern groove overlapping at least one of the electrode holes, the pattern groove extending only partially though the organic layer in a thickness direction.

18. The display device of claim 17, wherein
each of the organic layer patterns includes a pattern groove, and
a depth of the pattern groove farther from the display area is greater than a depth of a pattern groove closer to the display area.

19. The display device of claim 17, wherein
each of the organic layer patterns includes a pattern groove, and
a depth of the pattern groove closer to the display area is greater than a depth of a pattern groove farther from the display area.

20. The display device of claim 17, wherein at least one of the organic layer patterns entirely covers at least one of the electrode holes.

21. The display device of claim 1, wherein the at least one of the organic layer patterns includes a second pattern hole adjacent to the pattern hole, the second pattern hole not overlapping any of the electrode holes.

* * * * *